(12) United States Patent
Rice et al.

(10) Patent No.: US 9,640,948 B2
(45) Date of Patent: May 2, 2017

(54) METHOD FOR MODE CONTROL IN MULTIMODE SEMICONDUCTOR WAVEGUIDE LASERS

(71) Applicant: Northrop Grumman Systems Corporation, Falls Church, VA (US)

(72) Inventors: Robert R. Rice, Simi Valley, CA (US); Elizabeth T. Kunkee, Manhattan Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/151,538

(22) Filed: May 11, 2016

(65) Prior Publication Data

US 2016/0254649 A1 Sep. 1, 2016

Related U.S. Application Data

(62) Division of application No. 12/150,415, filed on Apr. 28, 2008, now Pat. No. 9,368,935.

(51) Int. Cl.
| | |
|---|---|
| *H01L 21/44* | (2006.01) |
| *H01S 5/22* | (2006.01) |
| *H01S 5/042* | (2006.01) |
| *H01S 5/024* | (2006.01) |
| *H01S 5/028* | (2006.01) |
| *H01S 5/065* | (2006.01) |
| *H01S 5/10* | (2006.01) |
| *H01S 5/20* | (2006.01) |

(52) U.S. Cl.
CPC .............. *H01S 5/22* (2013.01); *H01S 5/0287* (2013.01); *H01S 5/02469* (2013.01); *H01S 5/0425* (2013.01); *H01S 5/0655* (2013.01); *H01S 5/1014* (2013.01); *H01S 5/1053* (2013.01); *H01S 5/1064* (2013.01); *H01S 5/2036* (2013.01); *H01S 2301/166* (2013.01)

(58) Field of Classification Search
CPC ...... H01S 5/22; H01S 5/02469; H01S 5/0287; H01S 5/0425; H01S 5/1053; H01S 5/0655; H01S 2301/166; H01S 5/1014; H01S 5/2036; H01S 5/1064
USPC ........................................................ 438/597
See application file for complete search history.

(56) References Cited

U.S. PATENT DOCUMENTS

| | | | | |
|---|---|---|---|---|
| 6,800,914 | B2 * | 10/2004 | Ito | H01L 31/107 257/186 |
| 2006/0187988 | A1 * | 8/2006 | Tanaka | B82Y 20/00 372/45.01 |
| 2008/0070379 | A1 * | 3/2008 | Kikuchi | H01L 21/76898 438/460 |

* cited by examiner

*Primary Examiner* — Xinning Niu
*Assistant Examiner* — Vu A Vu
(74) *Attorney, Agent, or Firm* — Patti & Malvone Law Group, LLC

(57) ABSTRACT

One embodiment is a wide stripe semiconductor waveguide, which is cleaved at a Talbot length thereof, the wide stripe semiconductor waveguide having facets with mirror coatings. A system provides for selective pumping the wide stripe semiconductor waveguide to create and support a Talbot mode. In embodiments according to the present method and apparatus the gain is patterned so that a single unique pattern actually has the highest gain and hence it is the distribution that oscillates.

7 Claims, 9 Drawing Sheets

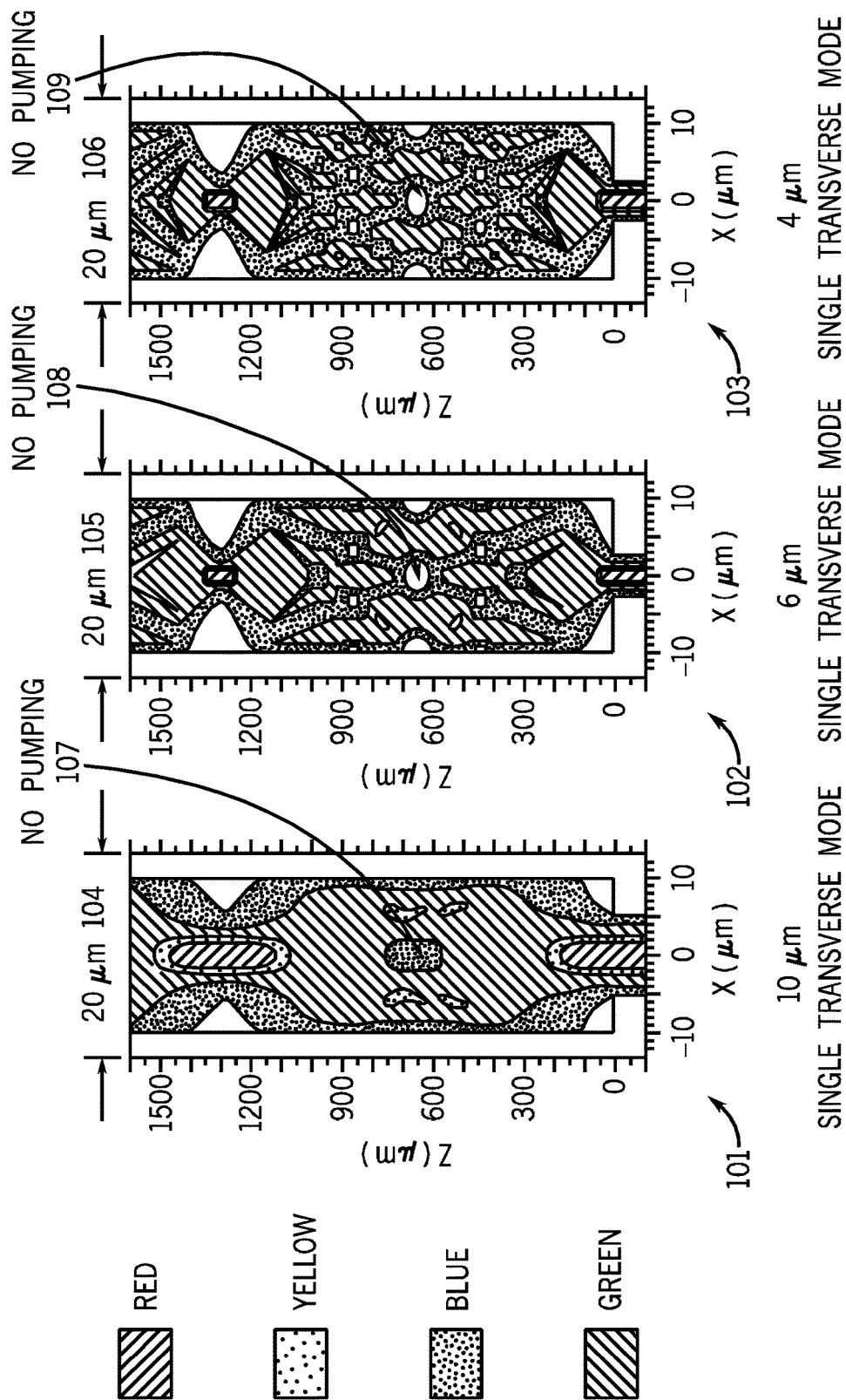

METHOD FOR MODE CONTROL IN MULTIMODE SEMICONDUCTOR WAVEGUIDE LASERS

TECHNICAL FIELD AND PARENT CASE

The invention relates generally to semiconductor lasers and, in particular, to mode control in semiconductor lasers. This Patent Application is a Division of Ser. No. 12/150,415 (U.S. Pat. No. 9,368,935.)

BACKGROUND

Laser diodes emit a diffraction limited beam in a fast direction, but typically emit wide multimode beams in a slow direction. For many applications, it is desirable that laser diodes also emit a diffraction limited beam in a slow direction.

Most laser diodes up till now are edge emitters, that is, the beam exists in the semiconductor waveguide layers and exits from the cleaved edge of the processed laser diode chip. These are also called Fabry-Perot diode lasers since the cavity is essentially similar to that of a conventional gas or solid state laser but formed inside the semiconductor laser diode chip itself. The mirrors are either formed by the cleaved edges (also called "facets") of the chip or (for high performance types like those that are very stable or tunable) one or both of these are anti-reflection coated and external mirrors are added.

Vertical cavity surface emitting laser diodes, on the other hand, emit their beam from their top surface (and potentially bottom surface as well). A cavity may be formed of a hundred or more layers consisting of mirrors and active laser semiconductor, and all may be formed epitaxially on a bulk (inactive) substrate, which in some cases is etched away in the vicinity of the laser cavity.

There are also optically pumped semiconductor lasers. Nearly all semiconductor lasers are powered by electrical current through the gain medium. However, for certain materials and device configurations, it is also possible to use another laser to optically pump its gain medium. This has some significant advantages in terms of controlling transverse and longitudinal modes and beam shape.

Vertical extended cavity surface emitting lasers are known. They are very similar to the optically pumped semiconductor laser, but use electrical pumping similar to a conventional edge-emitting laser diode or vertical cavity surface emitting laser diodes. However, the extended cavity allows frequency doubling or other nonlinear processes to be performed within the laser resonator, much like in the optically pumped semiconductor laser.

SUMMARY

One embodiment of the present method and apparatus encompasses an apparatus. The apparatus may comprise: a wide stripe semiconductor waveguide which is cleaved at a Talbot length thereof, the wide stripe semiconductor waveguide having facets with mirror coatings; and system for selective pumping the wide stripe semiconductor waveguide to create and support a Talbot mode. The wide stripe waveguide, defined by a lateral index step and supporting a single transverse mode in the (fast) direction normal to the epitaxial layers, comprises the laser diode structure and supports many modes in the (slow) direction parallel to the plane of the epitaxial structure.

Another embodiment of the present method and apparatus encompasses a method. In one example the method for patterning current injection may comprise: depositing a layer of SiN on a surface of a wide stripe semiconductor waveguide; patterning vias in the layer of SiN where current injection is desired; and covering the layer of SiN and the surface of the wide stripe semiconductor waveguide with ohmic metal.

In another example the method for patterning current injection may comprise: etching through a p+ cap layer of a wide stripe semiconductor waveguide to reduce current spreading; depositing a nitride on the p+ cap layer, and etching vias in the nitride for current injection in predetermined areas, again followed by covering the surface of the wide stripe semiconductor waveguide with ohmic metal.

In a further example the method for patterning current injection may comprise: using ion implant isolation where current injection should be avoided; and covering the surface of the wide stripe semiconductor waveguide with ohmic metal. In a variant on this embodiment, the ion implants can be spatially distributed in a way that allows for a controlled spatial variation of the effective electrical current density.

DESCRIPTION OF THE DRAWINGS

The features of the embodiments of the present method and apparatus are set forth with particularity in the appended claims. These embodiments may best be understood by reference to the following description taken in conjunction with the accompanying drawings, in the several figures of which like reference numerals identify like elements, and in which:

FIG. 1A depicts an embodiment according to the present method and apparatus with a 20 µm transverse rib structure and a 10 µm single transverse mode.

FIG. 1B depicts an embodiment according to the present method and apparatus with a 20 µm transverse rib structure and a 6 µm single transverse mode.

FIG. 1C depicts an embodiment according to the present method and apparatus with a 20 µm transverse rib structure and a 4 µm single transverse mode.

DETAILED DESCRIPTION

Figure 2A:
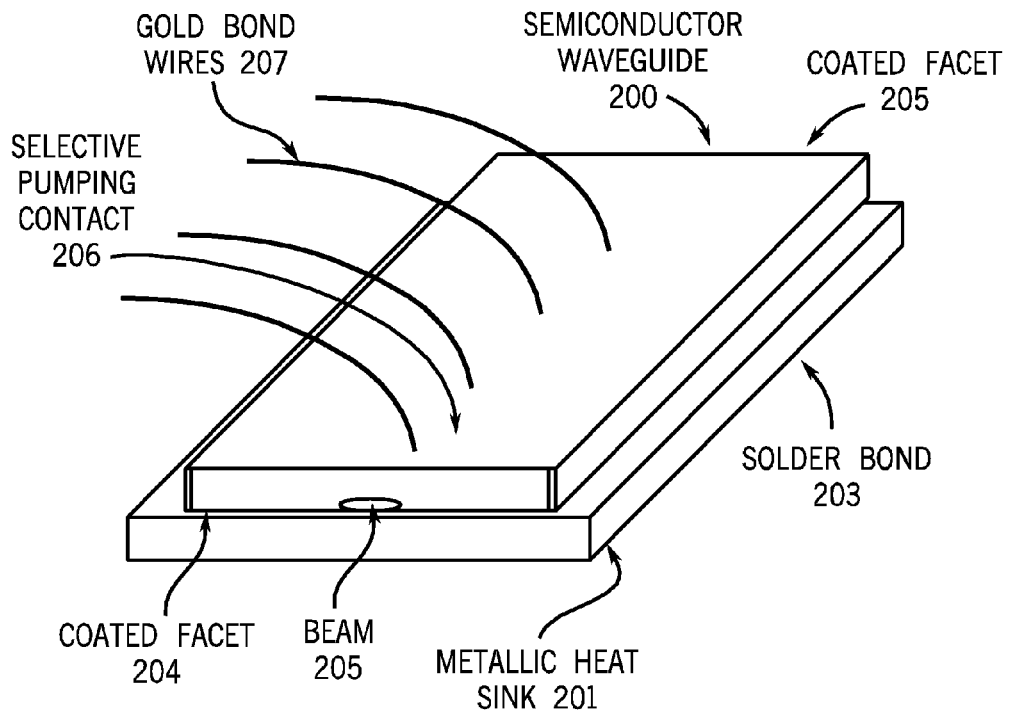
FIGS. 2A and 2B depict a semiconductor laser diode having a Talbot patterned contact current injection pattern.

In embodiments according to the present method and apparatus selective pumping creates (and supports) a diffraction limited transverse Talbot mode. In laser diodes, cavities may be cleaved at a self-imaging length, and a special contact metal pattern may be formed on the stripes to control the lateral mode structure. According to the present method and apparatus, patterned electrical contacts may produce a strong spatial filtering effect in the multi-transverse lateral waveguide. When a wide stripe semiconductor waveguide with the appropriate electrical contact pattern applied is cleaved at the Talbot length and the facets coated with appropriate mirror coatings (highly reflective and partially transmitting), an electrically pumped oscillator with interesting properties is formed. By definition, the transverse modes of the guide have varying propagation constants such that the length of the resonator L is an integral number of half waves for each transverse mode. The axial modes for each transverse mode are separated in frequency by c/2 nL, wherein n will not generally be a precisely constant value for all modes, but for a particular a cavity length L, an optical frequency exists such that the cavity is resonant for all transverse optical modes. When this optical self-imaging situation prevails, any field distribution on one facet is reimaged on that facet with gain after a round trip; there is nothing to prevent an arbitrary ensemble of modes with random phase and amplitude, all at the common resonant frequency, from oscillating (except perhaps gain saturation effects to second order).

In embodiments according to the present method and apparatus the gain is patterned so that a single unique pattern actually has the highest gain and is hence the distribution that oscillates. Hence, a beam with a Gaussian amplitude distribution with an arbitrary diameter 2W, which can be quite different in width from that of the lowest order transverse waveguide mode, can therefore be forced to oscillate with a flat phase front at the facets by matching the gain to the diffraction patterns that form within the waveguide. Thus, the operation of the present device is also potentially on a single frequency as well. It should be understood that a different contact pattern could generate a supergaussian (top-hat) beam with equal facility. More generally, a contact can be determined to generate a wide range of electric field distributions that are expected to operate in a stable manner.

For a given cavity length L, the self imaging frequency is given by $Lc/4na^2$, where n is the effective index of the waveguide and a is the stripe width. In reality, the self-imaging condition holds to a tolerable approximation over a small band of frequencies (the Talbot bandwidth). Longitudinal cavity resonances, also referred to as axial modes, are known to occur periodically in a semiconductor waveguide with a frequency separation of c/2 nL, and those axial modes within both the semiconductor gain bandwidth and the Talbot bandwidth are strongly amplified; axial frequencies satisfying neither condition are not amplified strongly and are hence rejected. If only one such frequency is within the semiconductor gain line, the oscillation will be single frequency. The present method also supports conventional approaches for achieving single frequency oscillation such as DFB gratings or cleaved coupled cavities (for example at a half Talbot plane). In embodiments according to the present method and apparatus the self-imaging property comes into play along with the strong spatial filtering provided by the patterned electrical contacts.

FIG. 1A depicts an embodiment according to the present method and apparatus in which a wide stripe semiconductor waveguide 101 has a 20 μm transverse rib structure 104 and a 10 μm single transverse mode as produced intentionally by an intentionally selected electrical contact pattern. The wide stripe semiconductor waveguide 101 has a contact pattern that prevents or limits current injection at blue or purple regions and permits current injection at the green and yellow locations; e.g. there is no pumping at location 107, that is, a location at which there is no current injection. The actual contact pattern will approximate the laser intensity distribution in the multimode waveguide so as to maximize current injection at the locations for which the laser intensity is maximum; thus, the gain is matched to that laser intensity distribution and less for any other.

FIG. 1B depicts another example embodiment according to the present method and apparatus in which a wide stripe semiconductor waveguide 102 has a 20 μm transverse rib structure 105 and a 6 μm single transverse mode as produced intentionally by an intentionally selected electrical contact pattern, the electrical contact pattern matching in this case the laser intensity pattern produced by a 6 μm single transverse mode in the same manner as for the case depicted in FIG. 1A.

FIG. 1C depicts an embodiment according to the present method and apparatus in which a wide stripe semiconductor waveguide 103 has a 20 μm transverse rib structure 106 and a 4 μm single transverse mode as produced intentionally by an intentionally selected electrical contact pattern. The electrical contact pattern matches in this case the laser intensity pattern produced by a 4 μm single transverse mode in the same manner as for the case depicted in FIG. 1A.

Figure 2B:
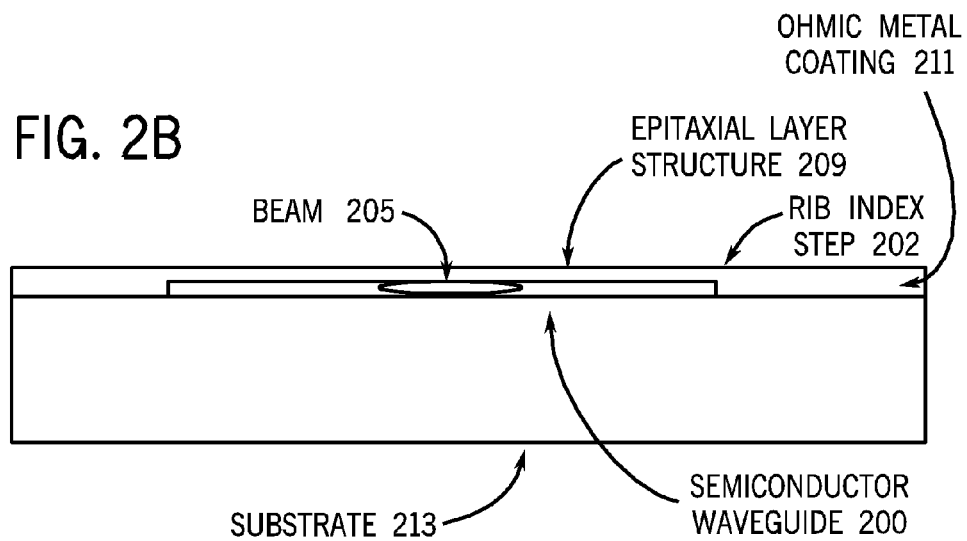

FIGS. 2A and 2B depicts an embodiment according to the present apparatus. In this embodiment a wide stripe semiconductor waveguide 200 is cleaved at a Talbot length thereof, the wide stripe semiconductor waveguide 200 being defined by transverse rib index steps 202 and having facets 204, 205 with mirror coatings. The wide stripe waveguide 200 may have a beam 205 on a metallic heat sink 201 with a solder bond 203. The wide stripe waveguide 200 may also have a selective pumping contact 206 and gold bond wires 207. As depicted particularly in FIG. 2B, the wide stripe waveguide 200 may have a substrate 213, an ohmic coating 211, and an epitaxial layer structure 209. A system may be provided for selective pumping the wide stripe semiconductor waveguide 200 to create and support a Talbot mode.

Figures 3A, 3B:
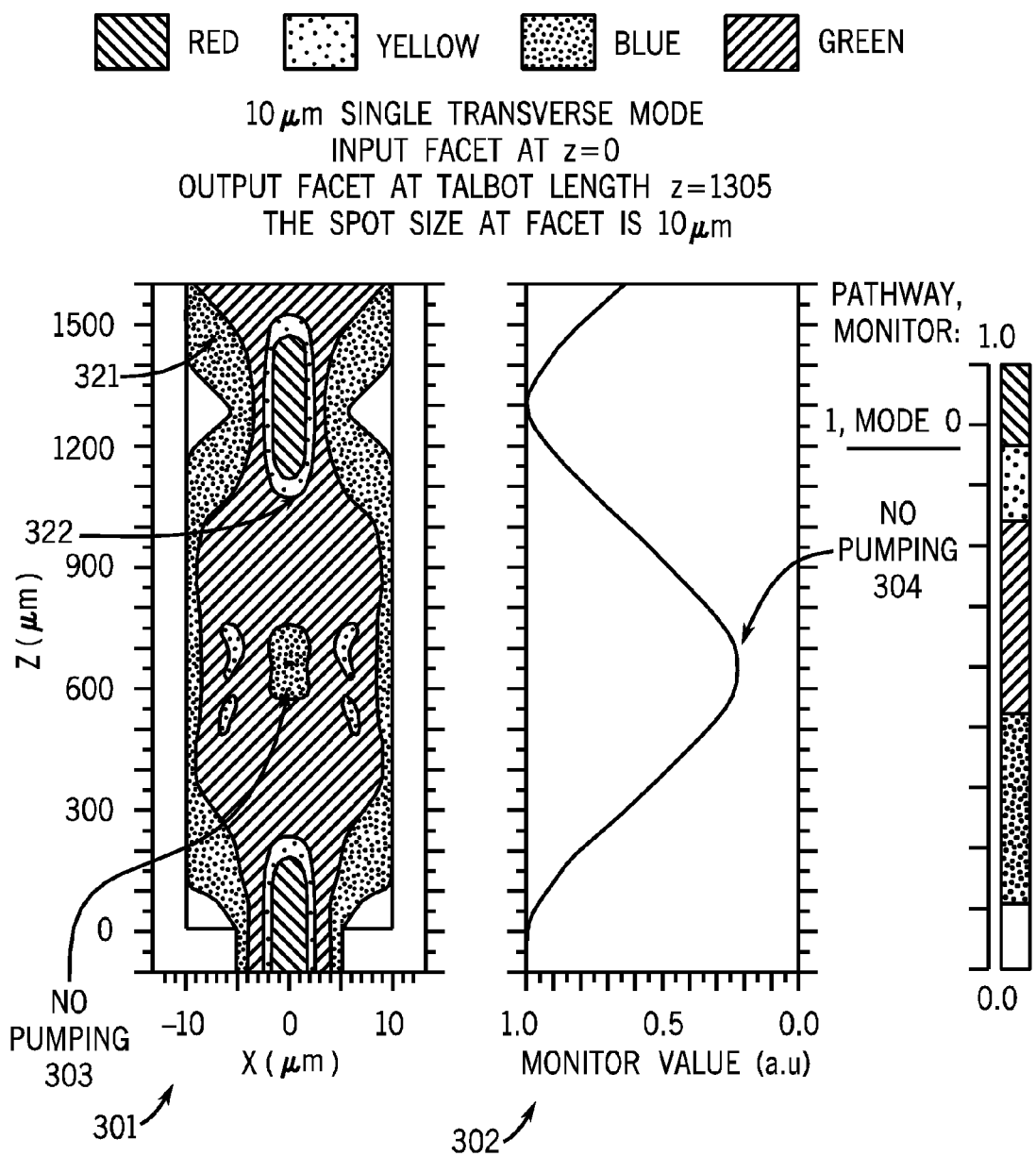
FIG. 3A depicts an embodiment according to the present method and apparatus with a 20 µm transverse rib structure and a 10 µm single transverse mode.
FIG. 3B depicts a graph of monitor value v for the mode of the FIG. 3A embodiment.

FIG. 3A depicts an embodiment according to the present method and apparatus in which a semiconductor waveguide having a 20 μm transverse rib structure 301 supports a 10 μm single transverse mode. To intentionally produce the 10 μm single transverse mode, the wide stripe semiconductor waveguide has been intentionally configured to have a contact pattern that prevents or limits current injection at blue or purple regions 321 and permits current injection at the green and yellow locations 322; e.g., there is no current injection pumping at location 303 and the contact pattern enables a current injection distribution that approximates the laser intensity distribution in the multimode waveguide. In this embodiment the wide stripe semiconductor waveguide 301 has an input facet at z=0, an output facet at Talbot length z=1305, and the spot size at the output facet is 10 μm.

FIG. 3B depicts a graph 302 of monitor value v, which is a computed measure of the lasing intensity at a given position in the waveguide plotted along the longitudinal axis, for the 10 μm mode in the FIG. 3A embodiment. The monitor value reaches a minimum at a point 304 corresponding to the no pumping location 303 in FIG. 3A.

Figures 4A, 4B:
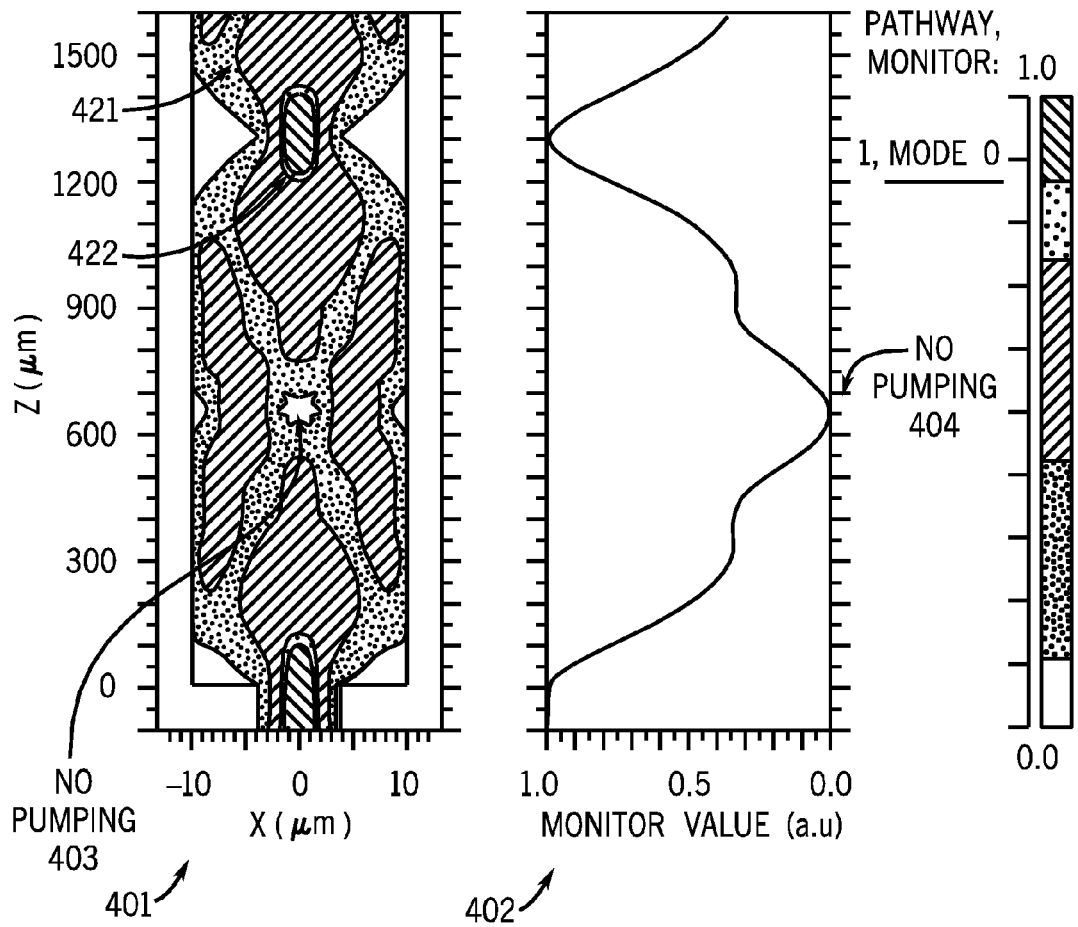
FIG. 4A depicts an embodiment according to the present method and apparatus with a 20 µm transverse rib structure and an 8 µm single transverse mode.
FIG. 4B depicts a graph of monitor value v for the mode of the FIG. 4A embodiment.

FIG. 4A depicts an embodiment according to the present method and apparatus in which a wide stripe semiconductor waveguide 401 has an 8 μm single transverse mode. To intentionally produce the 8 μm single transverse mode, the wide stripe semiconductor waveguide has been intentionally configured to have a contact pattern that prevents or limits current injection at blue or purple regions 421 and permits current injection at the green and yellow locations 422; e.g., there is no current injection pumping at location 403, and the contact pattern enables a current injection distribution that approximates the laser intensity distribution in the multimode waveguide. In this embodiment the wide stripe semiconductor waveguide 401 has an input facet at z=0, an output facet at Talbot length z=1305, and the spot size at the output facet is 8 μm.

FIG. 4B depicts a graph of monitor value v for the 8 μm mode in the FIG. 4A embodiment. The monitor value reaches a minimum at a point 404 corresponding to the no pumping location 403 in FIG. 4A.

Figures 5A, 5B:
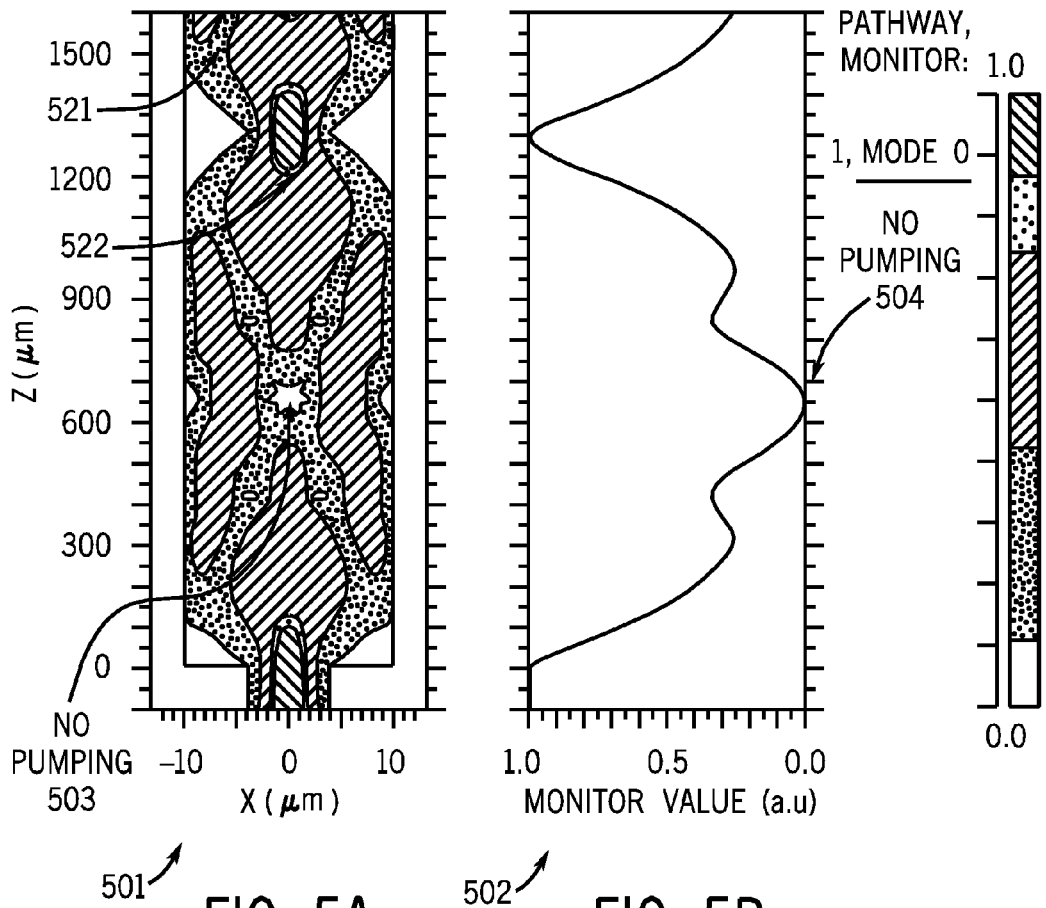
FIG. 5A depicts an embodiment according to the present method and apparatus with a 20 µm transverse rib structure and a 6 µm single transverse mode.
FIG. 5B depicts a graph of monitor value v for the mode of the FIG. 5A embodiment.

FIG. 5A depicts an embodiment according to the present method and apparatus in which a wide stripe semiconductor waveguide 501 supports a 6 μm single transverse mode. To intentionally produce the 6 μm single transverse mode, the wide stripe semiconductor waveguide has been intentionally configured to have a contact pattern that prevents or limits current injection at blue or purple regions 521 and permits current injection at the green and yellow locations 522. In this embodiment the wide stripe semiconductor waveguide 501 has an input facet at z=0, an output facet at Talbot length z=1305, and the spot size at the output facet is 6 μm.

FIG. 5B depicts a graph of monitor value v for the 6 μm mode in the FIG. 5A embodiment. The monitor value reaches a minimum at a point 504 corresponding to the no pumping location 503 in FIG. 5A.

Figures 6A, 6B:
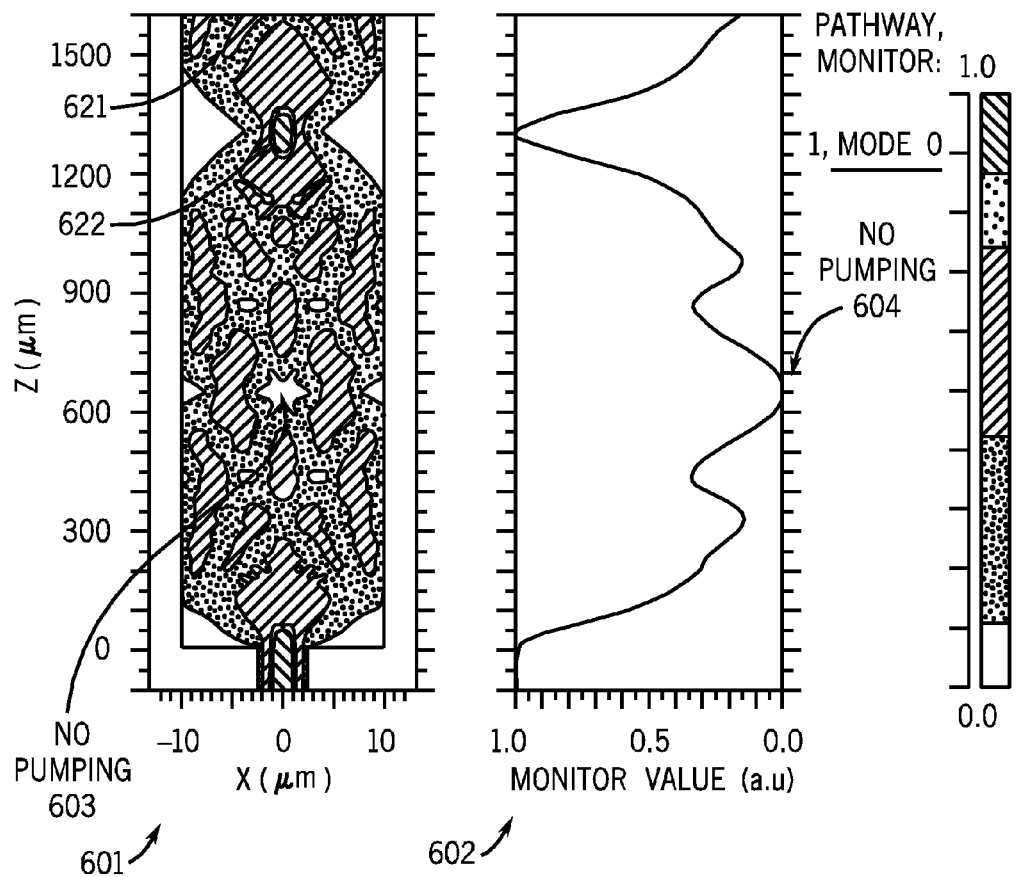
FIG. 6A depicts an embodiment according to the present method and apparatus with a 20 µm transverse rib structure and a 5 µm single transverse mode.
FIG. 6B depicts a graph of monitor value v for the mode of the FIG. 6A embodiment.

FIG. 6A depicts an embodiment according to the present method and apparatus in which a wide stripe semiconductor waveguide 601 supports a 5 μm single transverse mode. To intentionally produce the 5 μm single transverse mode, the wide stripe semiconductor waveguide has been intentionally configured to have a contact pattern that prevents or limits current injection at blue or purple regions 621 and permits current injection at the green and yellow locations 622. In this embodiment the wide stripe semiconductor waveguide 601 has an input facet at z=0, an output facet at Talbot length z=1305, and the spot size at the output facet is 5 μm.

FIG. 6B depicts a graph of monitor value v for the 5 μm mode in the FIG. 6A embodiment. The monitor value reaches a minimum at a point 604 corresponding to the no pumping location 603 in FIG. 6A.

Figures 7A, 7B:
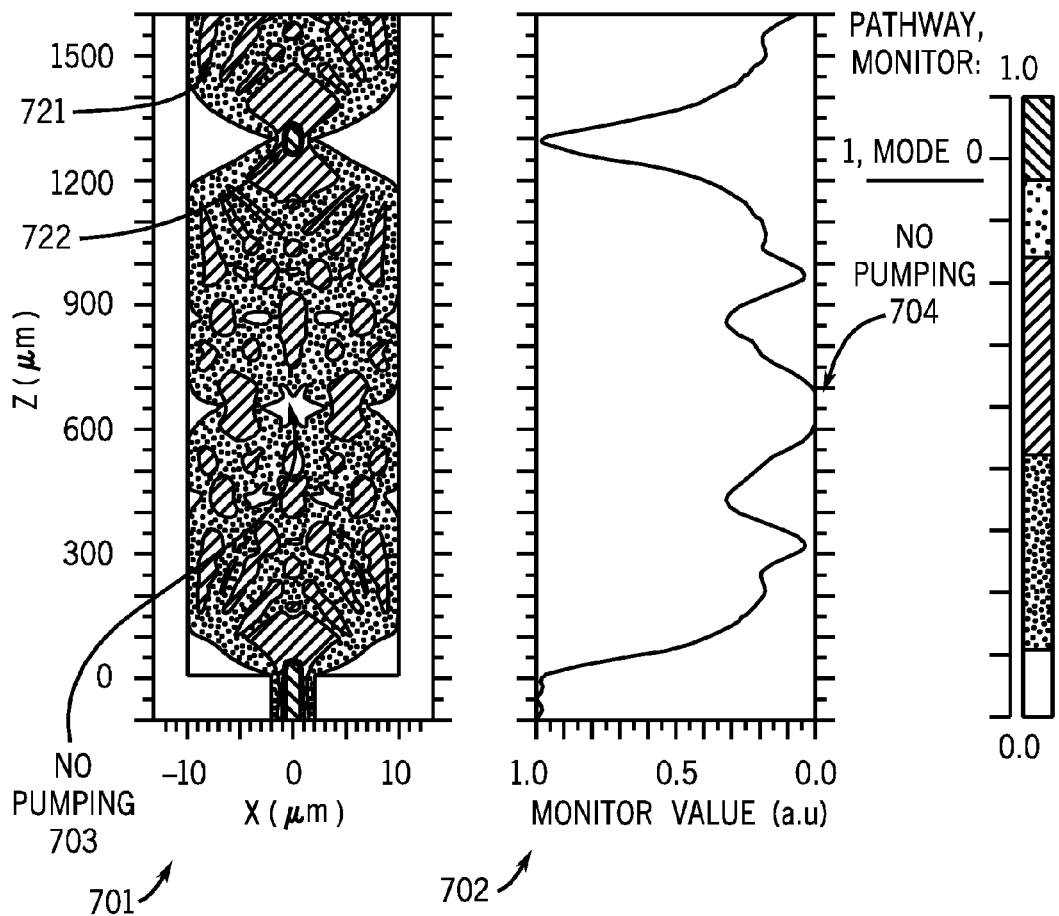
FIG. 7A depicts an embodiment according to the present method and apparatus with a 20 µm transverse rib structure and a 4 µm single transverse mode.
FIG. 7B depicts a graph of monitor value v for the mode of the FIG. 7A embodiment.

FIG. 7A depicts an embodiment according to the present method and apparatus in which a wide stripe semiconductor waveguide 701 supports a 4 μm single transverse mode. To intentionally produce the 4 μm single transverse mode, the wide stripe semiconductor waveguide has been intentionally configured to have a contact pattern that prevents or limits current injection at blue or purple regions 721 and permits current injection at the green and yellow locations 722. In this embodiment the wide stripe semiconductor waveguide 701 has an input facet at z=0, an output facet at Talbot length z=1305, and the spot size at the output facet is 4 μm.

FIG. 7B depicts a graph of monitor value v for the 4 μm mode in the FIG. 7A embodiment. The monitor value reaches a minimum at a point 704 corresponding to the no pumping location 703 in FIG. 7A.

Figure 8:
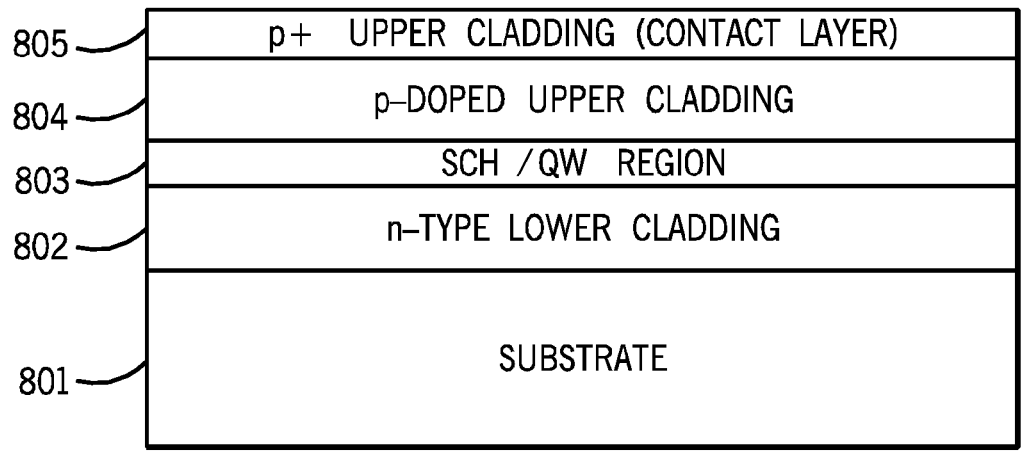
FIG. 8 is a cross-sectional view of a basic laser epitaxial structure for use in an embodiment according to the present method and apparatus.

FIG. 8 is a cross-sectional view of a basic laser epitaxial structure for use in an embodiment according to the present method and apparatus. This structure has an n-type lower cladding layer 802 on a substrate 801. Over the n-type lower cladding layer 802 are a SCH/QW region 803, a p-doped upper cladding 804, and a p+ upper cladding (contact layer or p+ cap layer) 805.

Figure 9:
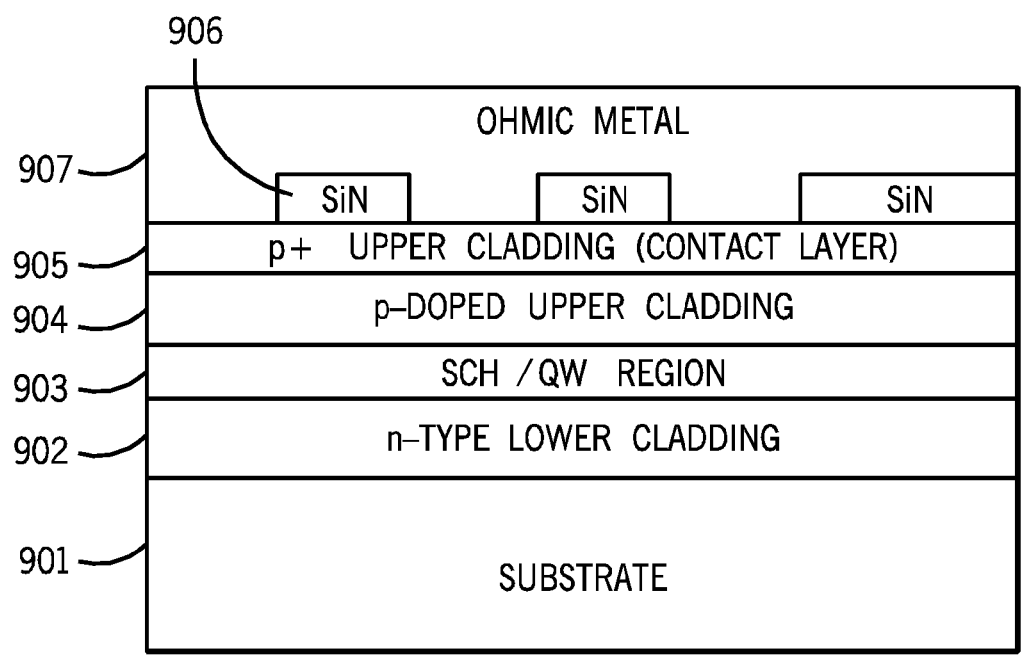
FIG. 9 is a cross-sectional view of one embodiment according to the present method and apparatus for patterning current injection.

FIG. 9 is a cross-sectional view of one embodiment according to the present method and apparatus for patterning current injection. This structure has an n-type lower cladding layer 902 on a substrate 901. Over the n-type lower cladding layer 902 are a SCH/QW region 903, a p-doped upper cladding 904, and a p+ upper cladding (contact layer or p+ cap layer) 905. On the p+ upper cladding 905 are formed areas 906 of SiN over which is deposited an ohmic metal 907. Vias in the nitride are provided according to a pattern where current injection is desired. Current spreading may be approximately 10 μm, which is acceptable for coarse geometries in which only very large areas are deprived of current injection.

Figure 10:
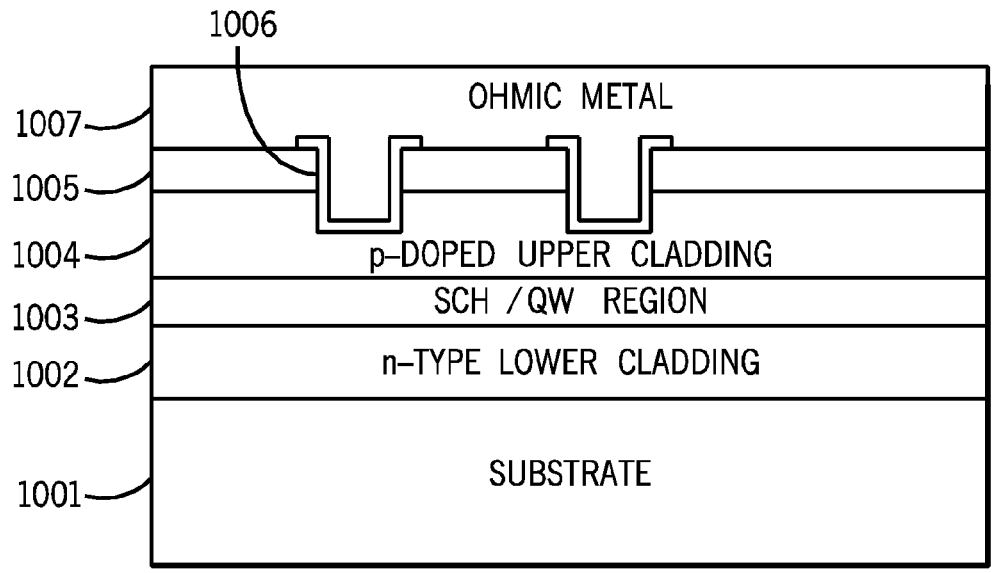
FIG. 10 is a cross-sectional view of another embodiment according to the present method and apparatus for patterning current injection.

FIG. 10 is a cross-sectional view of another embodiment according to the present method and apparatus for patterning current injection. This structure has an n-type lower cladding layer 1002 on a substrate 1001. Over the n-type lower cladding layer 1002 are a SCH/QW region 1003, a p-doped upper cladding 1004, and a p+ upper cladding (contact layer or p+ cap layer) 1005. On the p+ upper cladding 1005 are formed areas 1006 of SiN over which is deposited an ohmic metal 1007. The p+ upper cladding 1005 is etched through to reduce current spreading. Nitride is deposited and nitride vias are etched where current injection is desired. When etching is used to avoid lateral current spreading, the etch depth is critical (+/−10 nm). Such etch depth control is marginally feasible, but the etch depth will be a function of the size of the mask opening for finer features. There is a potential optical loss due to edge roughness of the etched current blocking pits.

Figure 11:
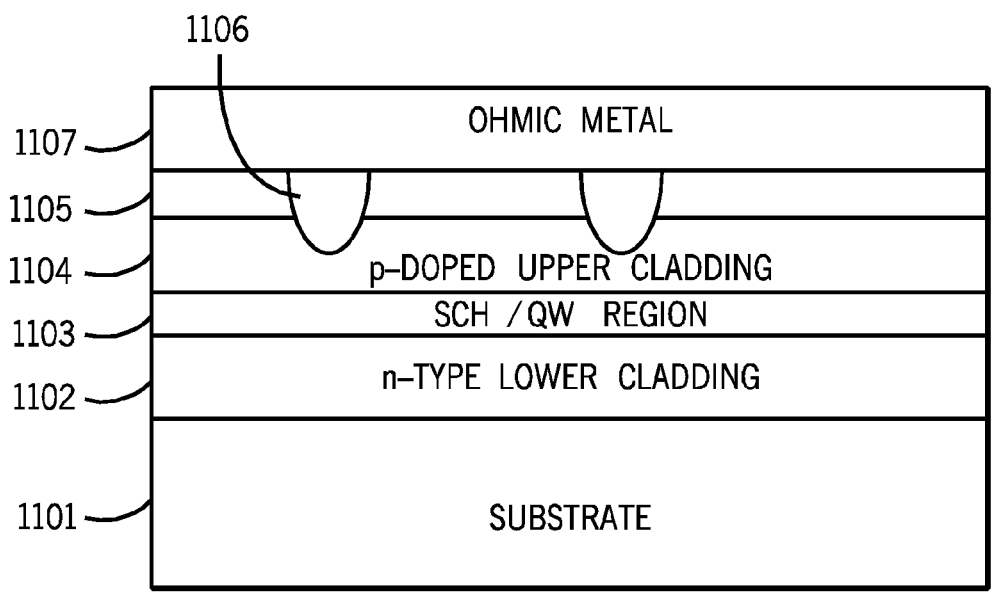
FIG. 11 is a cross-sectional view of a further embodiment according to the present method and apparatus for patterning current injection.

FIG. 11 is a cross-sectional view of a further embodiment according to the present method and apparatus for patterning current injection. Ion implant isolation may be used where current injection should be avoided. This structure has an n-type lower cladding layer 1102 on a substrate 1101. Over the n-type lower cladding layer 1102 are a SCH/QW region 1103, a p-doped upper cladding 1104, and a p+ upper cladding (contact layer or p+ cap layer) 1105. On the p+ upper cladding 1105 are formed areas 1106 of SiN over which is deposited an ohmic metal 1107. Ion implant isolation is limited by the line size of the photoresist used. This is typically thick for an implant step. Minimum feature size is also limited by the implant straggle, which is the lateral excursion of the implant beyond the photoresist boundary. Implant areas as small as 1.5 μm×1.5 μm may be achieved.

The present method and apparatus are not limited to the particular details of the depicted embodiments and other modifications and applications are contemplated. Certain other changes may be made in the above-described embodiments without departing from the true spirit and scope of the present method and apparatus herein involved. It is intended, therefore, that the subject matter in the above depiction shall be interpreted as illustrative and not in a limiting sense.

What is claimed is:

1. A method, comprising:

depositing, for patterning current injection, a layer of SiN on a surface of a wide stripe semiconductor waveguide;

patterning vias in the layer of SiN where current injection is desired;

covering the layer of SiN and the surface of the wide stripe semiconductor waveguide with ohmic metal; and selectively pumping the wide stripe semiconductor waveguide to create and support a desired electric field distribution comprising a diffraction limited transverse Talbot mode.

2. The method according to claim 1, wherein a lateral current spreading width is about 10 μm in the semiconductor and wherein predetermined areas of the wide stripe semiconductor waveguide are deprived of current injection.

3. The method of claim 1, wherein the wide stripe waveguide is defined by a lateral index step and supports a single transverse mode in a fast direction normal to epitaxial layers having a predetermined laser diode structure with a plurality of modes in a slow direction parallel to a plane of an epitaxial structure.

4. A method, comprising:

etching, for patterning current injection, through a p+ cap layer of a wide stripe semiconductor waveguide to reduce current spreading;

depositing a nitride on the p+ cap layer;

etching vias in the nitride for current injection in predetermined areas; and selectively pumping the wide stripe semiconductor waveguide to create and support a desired electric field distribution comprising a diffraction limited transverse Talbot mode.

5. The method according to claim 4, wherein, when etching is used to avoid lateral current spreading, an etch depth having a tolerance of +/−10 nm.

6. The method according to claim 4, wherein an etch depth of the cap layer is a function of a size of mask opening.

7. The method of claim 4, wherein the wide stripe waveguide is defined by a lateral index step and supports a single transverse mode in a fast direction normal to epitaxial layers having a predetermined laser diode structure with a plurality of modes in a slow direction parallel to a plane of an epitaxial structure.

* * * * *